US007002175B1

(12) United States Patent
Singh et al.

(10) Patent No.: US 7,002,175 B1
(45) Date of Patent: Feb. 21, 2006

(54) METHOD OF MAKING RESONANT TUNNELING DIODES AND CMOS BACKEND-PROCESS-COMPATIBLE THREE DIMENSIONAL (3-D) INTEGRATION

(75) Inventors: Jagar Singh, Singapore (SG); Yong Tian Hou, Singapore (SG); Ming Fu Li, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/961,355

(22) Filed: Oct. 8, 2004

(51) Int. Cl.
*H01L 29/06* (2006.01)

(52) U.S. Cl. .......................... 257/25; 257/777; 438/455

(58) Field of Classification Search .................. 257/25, 257/777; 438/107, 455
See application file for complete search history.

(56) References Cited

U.S. PATENT DOCUMENTS

| 5,466,949 A | 11/1995 | Okuno ........................ 257/25 |
| 5,616,515 A | 4/1997 | Okuno ........................ 438/478 |
| 6,208,555 B1 | 3/2001 | Noble ........................ 365/159 |
| 2003/0049894 A1 | 3/2003 | Berger et al. ............... 438/183 |

FOREIGN PATENT DOCUMENTS

EP 668618 A2 5/1994

OTHER PUBLICATIONS

Co-pending U.S. Patent Application ImE-03-009, U.S. Appl. No. 10/767,275, filed Jan. 29, 2004, "CMOS Compatible Low Band Offset Double Barrier Resonant Tunneling Diode".

L.L. Chang et al., "Resonant Tunneling Charcteristics in $SiO_2$/Si Double-Barrier Structures in a Wide Range of Applied Voltage", Appl. Phys. Lett., vol. 24, pp. 593-595, Jun. 1974.

"Effect of Barrier Thickness on the Interface and Optical Properties of InGaN/GaN Multiple Quantum Wells," by Dong-Joon Kim et al., Jpn. J. Appl. Phys., vol. 40 (2001) pp. 3085-3088.

Rafael Reif et al., "Fabrication Technologies for Three-Dimensional Integrated Circuits", Int'l Symp. on Quality Elec. Design, Mar. 18-21, 2002, San Jose, CA, pp. 33-37.

K.C. Saraswat et al., "3-D ICs: Motivation, Performance Analysis, and Technology," 197th Meeting of the Electrochemical Society, Toronto, Canada, May 2000.

*Primary Examiner*—Sara Crane
(74) *Attorney, Agent, or Firm*—George O. Saile; Stephen B. Ackerman

(57) ABSTRACT

A double barrier resonant tunneling diode (RTD) is formed and integrated with a level of CMOS/BJT/SiGe devices and circuits through processes such as metal-to-metal thermocompressional bonding, anodic bonding, eutectic bonding, plasma bonding, silicon-to-silicon bonding, silicon dioxide bonding, silicon nitride bonding and polymer bonding or plasma bonding. The electrical connections are made using conducting interconnects aligned during the bonding process. The resulting circuitry has a three-dimensional architecture. The tunneling barrier layers of the RTD are formed of high-K dielectric materials such as $SiO_2$, $Si_3N_4$, $Al_2O_3$, $Y_2O_3$, $Ta_2O_5$, $TiO_2$, $HfO_2$, $Pr_2O_3$, $ZrO_2$, or their alloys and laminates, having higher band-gaps than the material forming the quantum well, which includes Si, Ge or SiGe. The inherently fast operational speed of the RTD, combined with the 3-D integrated architecture that reduces interconnect delays, will produce ultra-fast circuits with low noise characteristics.

40 Claims, 6 Drawing Sheets

METHOD OF MAKING RESONANT TUNNELING DIODES AND CMOS BACKEND-PROCESS-COMPATIBLE THREE DIMENSIONAL (3-D) INTEGRATION

RELATED APPLICATION

This application is related to previously filed application Ser. No. 10/767,275 Filing Date: Jan. 29, 2004 that is assigned to the same assignee as the present application.

BACKGROUND OF THE INVENTION

1. Field of the Invention

This invention relates to solid state electronics, in particular to a novel high frequency silicon based resonant tunnel diode with negative differential resistance.

2. Description of the Related Art

The tunnel diode formed by a heavily doped p-n junction was invented by Esaki in 1958. This diode operated on the basis of interband tunneling, wherein charge carriers moved between valence and conduction bands by tunneling through an intervening potential barrier. Subsequently, in 1974, Esaki and co-workers demonstrated a resonant tunneling diode (RTD) consisting of two potential barriers separated by a potential well using a III–V compound semiconductor (L. L Chang, L. Esaki, and R. Tsu, "Resonant tunneling in the semiconductor double barriers," Appl. Phys. Lett., Vol. 24, pp. 593–595, June 1974). In this device, the tunneling was intraband, between conduction and conduction or valence and valence bands, through an intermediate quantum well whose bound state energies corresponded to those energies of injected electrons which would have the maximum probability for tunneling.

Over the past three decades, RTDs exhibiting negative differential resistance (NDR) have received a great deal of attention due to their potential for application in electronics. Since the RTD offers the capability of operation as an oscillator, an amplifier and a mixer at extremely high frequency and with high resonant current density and very low noise, its implementation in integrated circuits would minimize the total device counts, and standby current. Indeed, Noble (U.S. Pat. No. 6,208,555) provides an SRAM memory cell that includes two tunnel diodes coupled in series and a MOSFET. RTDs with good I–V characteristics have been demonstrated in heteroepitaxial systems such as GaAs/AlGaAs/GaAs (Dong-Joon Kim, Yong-Tae Moon, Keun-Man Song and Seong-Ju Park, "Effect of barrier thickness on the interface and optical properties of InGaN/GaN multiple quantum wells," Jpn. J. Appl. Phys., Part 1, 40, 3085 (2001)) and SiGe/Si (U.S. Published Patent Application No. 2003/0049894) and will be briefly discussed below. In addition, Bate et al. (European Published Application No. 94107763.8, Publication No. 0 668 618 A2) discloses a resonant tunneling device in which a silicon well is sandwiched between epitaxially grown layers of $CaF_2$.

Although RTDs have been known and used in demonstrating the operation of an oscillator, an amplifier and a mixer at extremely high frequencies and with high resonant current density and very low noise, while maintaining the minimum total device counts and standby current desirable in integrated circuit (IC) technology, they have been difficult to integrate into mainstream Si CMOS (Complementary Metal Oxide Semiconductor) IC technology.

In the RTD structure, the silicon film is sandwiched on each side by a $SiO_2$ dielectric layer. The quantum barrier is made from this dielectric film, which has a relatively larger band gap than silicon. $SiO_2$ is not the only material suitable for the barrier layer that has a wider band gap than silicon. The difference in the band gap between the silicon and its surrounding barrier layers results in a positive conduction band-offset (difference between the conduction band edge and barrier height) with respect to the smaller band gap of Si. The silicon layer between the two barriers, that has a width close to the electron's deBroglie wavelength, forms a quantum well that supports a band containing several discrete electron energy levels that may be broadened by various processes. The electron transport across the barrier occurs by means of this energy band (or bands), which, by its presence, promotes the tunneling of injected electrons and produces a corresponding tunneling current when an appropriate bias voltage is applied. When the band energy of the well is close to the conduction electron energy of the emitter electrode (the "resonance" referred to in the device name), the maximum tunneling current is produced. This current decreases as the conduction electron energy departs from the energy in the band due to the applied bias. This reduction in current as the voltage is increased gives rise to what is called the negative differential resistance (NDR) behavior in the I–V characteristics of the tunnel diode.

Although the $SiO_2$ double barrier structure surrounding a silicon well was reported in H. Ikeda, M. Iwasaki, Y. Ishikawa, and M. Tabe, "Resonant tunneling characteristics in SiO2/Si double barrier structure in a wide range of applied voltage," Applied Physics Letters, vol. 83, pp. 1456–1458, 2003, it remains a challenge for $SiO_2/Si/SiO_2$ type RTDs to find their way into applications. This is a result of their poor performance, which is due mainly to the large band offset between $SiO_2$ and Si and the excessive thickness of the $SiO_2$ of the buried oxide layer in a silicon-on-insulator (SOI) substrate. Okuno, in both (U.S. Pat. No. 5,466,949) and (U.S. Pat. No. 5,616,515) discloses a resonant tunneling diode formed by layering silicon dioxide barrier layers on either side of a germanium well, but, as already noted, this device structure is not compatible with silicon processing schemes.

Recently, new forms of bonding have provided a possible approach to the integration of RTDs with the backend copper interconnect technology commonly used in IC fabrications. This integration involves low temperature bonding techniques such as Cu—Cu thermocompression, and plasma bonding. The efficacy and detailed description of these and similar methods is described by Rafael Reif, Andy Fan, Kuan-Neng Chen and Shamik Das in "Fabrication Technologies for Three-Dimensional Integrated Circuits," International Symposium on Quality Electronic Design, Mar. 18–21, 2002, San Jose, Calif., pp. 33–37. The type of integration demonstrated therein leads, in the present invention, to 3-D device and circuit architectures in which CMOS devices lie on the silicon plane, while RTD devices are placed at the interconnect level. As is pointed out by K. C. Saraswat, K. Banerjee, A. Joshi, P. Kalavade, S. J. Souri and V. Subramanian, in "3-D ICs with multiple Si layers: performance analysis and technology," 197th Meeting of The Electrochemical Society, Toronto, May 2000, these techniques offer an effective use of the device area, while the replacement of lengthy horizontal interconnects by much shorter and more direct vertical interconnects leads to lower interconnect delays in overall circuit performance. Moreover, the 3-D integration with CMOS/BJT/SiGe (BJT being bi-polar junction technology) devices can lead to innovative circuit designs for future analog and digital circuit technologies, especially those involving SRAM and DRAM. By combining the advantages of 3-D architecture with the inherent fast tunneling properties of RTDs, an excellent emerging candidate for the next generation of nanoelectronic devices and circuits is produced.

SUMMARY OF THE INVENTION

A first object of the present invention is to provide a method of forming an RTD device that is compatible with mainstream back end and front end CMOS/BJT/SiGe technologies.

A second object of the present invention is to provide a method of forming an RTD device that is compatible with front end CMOS/BJT/SiGe technologies and whose integration is compatible with back end copper interconnect technologies.

A third object of the present invention is to provide a method of forming an RTD device that allows flexibility in choosing the mixed and asymmetric barrier materials and electrodes so as to enhance the RTD performance while maintaining process and integration requirements and ease of fabrication.

A fourth object of the present invention is to provide a method of forming such an RTD device wherein front and back end integration includes simple integration with both active and passive interconnect-level devices such as MIM (metal-insulator-metal) capacitors, interconnect inductors, phase shift memories and random access memories.

A fifth object of the invention is to provide a method of forming such an integrated RTD device wherein a 3-D architecture relative to the silicon plane is achieved.

A sixth object of the present invention is to provide a method whereby RTD devices can be formed first and then subsequently integrated with planar CMOS/BJT/SiGe devices, circuits and structures using conventional low temperature bonding processes such as anodic bonding, thermal compression, eutectic bonding, plasma bonding, silicon-to-silicon bonding, silicon dioxide bonding, silicon nitride bonding and polymer bonding.

A seventh object of the present invention is to provide such a formation and integration method whereby a required device area can be selected so as to meet the desired performance parameters of connected devices and circuits.

An eighth object of the present invention is to provide such a method of forming integrated RTD devices, wherein the devices so formed have good I–V characteristics, such as high peak-to-valley ratio (PVR).

A ninth object of the present invention is to provide a method of fabricating a plurality of integrated RTD devices so that the devices so formed have a high device density across a wafer substrate.

A tenth object of the present invention is to fabricate both active and passive devices using a method and structure similar to that applied to the formation of the RTD devices.

An eleventh object of the present invention is to provide a method of fabricating integrated RTD circuits at the interconnect level.

A twelfth object of the present invention is to provide a method of producing integrated RTD circuits that have small interconnect delays when the RTDs and other associated circuit devices are bonded and electrically connected using Cu—Cu pads.

A thirteenth object of the present invention is to provide the integrated RTD devices and circuits so formed.

The objects of the present invention will be achieved by a process in which a thin silicon film (the quantum well), of thickness less than 10 nanometers (nm) is sandwiched on each side by a dielectric layer (the barrier layer) formed of low band offset, high-K (high dielectric constant) dielectric materials such as $SiO_2$, $Si_3N_4$, $Al_2O_3$, $Y_2O_3$, $Ta_2O_5$, $TiO_2$, $HfO_2$, $Pr_2O_3$, $ZrO_2$, or their alloys and laminates. These quantum barrier materials are characterized by a larger bandgap than silicon, the material forming the well. The properties of these dielectric barrier materials and their role in producing a tunneling diode structure of superior characteristics are fully set forth in related patent application Ser. No. 10/767,275, filing date: Jan. 29, 2004, which is fully incorporated herein by reference.

A schematic cross-sectional view of a typical double barrier (one barrier layer on each side of the well layer) RTD structure meeting the objects of the present invention is shown in FIG. 1. The RTD device layers are formed in the x-y planar direction, which is the planar direction of the upper surface (10) of the "handling" substrate, the term used to describe a finished processed wafer that is held in place so that it can be bonded with the RTD device structure in this invention. The handling substrate, in the present invention, includes the requisite CMOS (complementary metal-oxide semiconductor), BJT (bipolar junction technology) and SiGe (silicon-germanium) circuit elements with which RTD integration is to be achieved.

The RTD device (1000) includes a Si quantum well layer (50) less than 10 nm in thickness, that is formed between an upper (60) and lower (40) dielectric barrier layer having a high dielectric constant, each barrier layer being formed to a thickness less than 3 nm. It is noted that a Ge or SiGe well layer is an equivalent embodiment. An electron injection electrode (30) is formed beneath and on the lower barrier layer, the injection layer being preferably formed of semiconductor materials such as polysilicon, a-Si, SiGe, or Ge, and preferably formed to a thickness less than 3 nm. A collection electrode (70) is formed above and on the upper dielectric barrier layer, the collection electrode being formed of a metal or a semiconductor material such as that used in forming the injection electrode. It is noted that the dimensions of the well and barrier layers produce the energy levels required to create the resonant tunneling probabilities and superior negative differential resistance characteristics. A thermocompressionally bonded Cu—Cu layer (200), which is two Cu bonding pad layers (which can be pads or films), thermocompressionally bonded to each other, surface-to-surface, and illustrated as a single layer, joins the RTD device to the handling substrate (10). When aligned and joined by the Cu—Cu bonding pads, vias and associated interlayer interconnects (not shown) as well as the pads themselves, provide electrical connections between the RTD and the circuitry within the handling substrate. The lateral edges of the RTD device are contacted by dielectric isolation layers (75) of SiN to isolate the device from other nearby devices. The process steps leading to the formation of this structure will be described in detail below with reference to FIGS. 2a–i and FIGS. 3a–f.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein.

DESCRIPTION OF THE PREFERRED EMBODIMENTS

Figure 1:
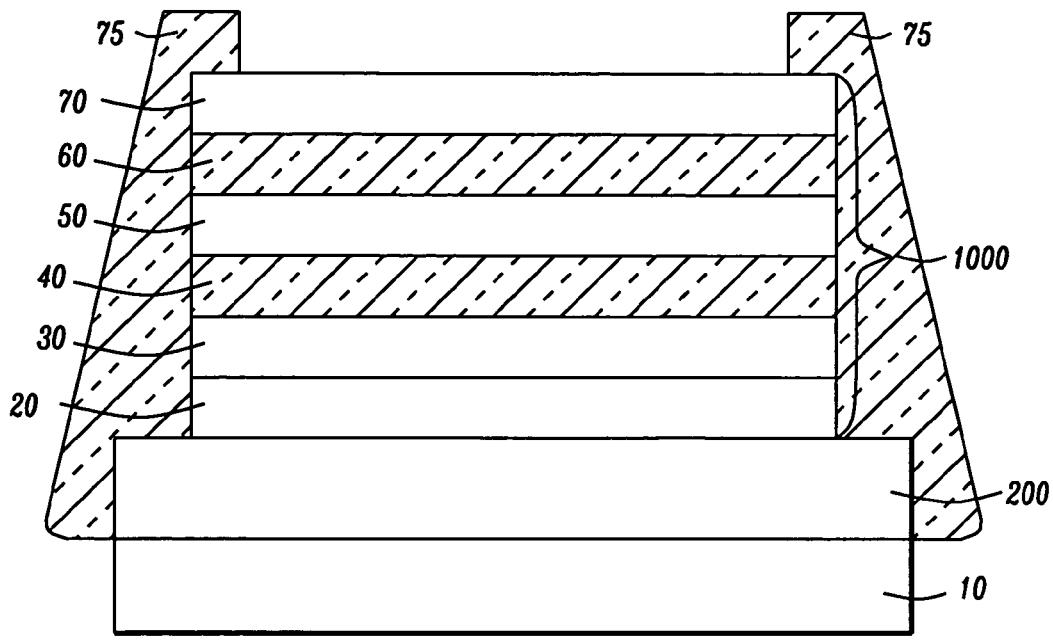
FIG. 1 is a schematic view of the cross-section of the integrated double barrier resonant tunnel diode (RTD) of the present invention.

The preferred embodiments of the present invention each teach a method of fabricating, within a SOI substrate, a double barrier resonant tunnel diode (RTD) of the cross-sectional form schematically illustrated in FIG. 1 and described above, and of integrating that RTD with an additional level of conventional CMOS/BJT/SiGe devices, circuits and structures formed within a separate handling substrate. The integration is achieved using processes such as Cu—Cu thermocompression or plasma bonding to physically bond and electrically connect the RTD to the handling substrate to achieve the integration. The method produces a three-dimensional (3-D) integrated architecture relative to the handling substrate that contains the CMOS/BJT/SiGe devices, structures and circuits. The 3-D architecture provides operating advantages, such as reduced interconnect delay, and when those advantages are combined with the inherent operational speed and negative differential resistance (NDR) characteristics of the RTD, a basis for ultra fast circuits having very low noise is formed.

In the case of an RTD having a silicon layer as the quantum well layer, such as the RTD depicted in FIG. 1, the fabrication process of the RTD begins most advantageously with a silicon-on insulator (SOI) wafer as a first substrate. The SOI wafer is a substrate of choice in many IC fabrication processes other than RTD fabrication, so its present use makes the invention described herein compatible with broader IC fabrication processes. However, the method of the present invention can also be applied advantageously to RTD structures having Ge quantum wells or SiGe quantum wells, in which cases the first substrate of choice would be a Ge-on-insulator (GOI) substrate or a SiGe-on-insulator substrate. It is also envisioned that other semiconductor materials could be formed into quantum well structures, in which case other substrates could be employed. Although the fabrication processes presented herein are applied in an exemplary manner to the formation of a Si quantum well RTD, and although Si is most probably the most common semiconductor material being employed in semiconductor fabrications, the generality of this method should be noted.

Figure 2A:
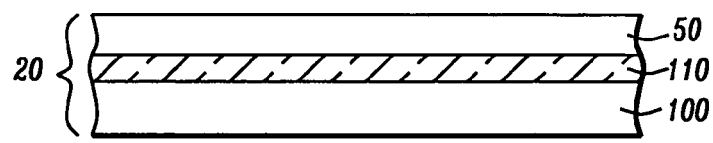
FIGS. 2a–i are a series of schematic illustrations of the process flow of the fabrication of the double barrier resonant tunnel diode of FIG. 1 integrated with a Cu—Cu thermocompressionally bonded back end.

Referring to FIG. 2a, there is shown an initial process step in a first embodiment that utilizes a semiconductor-on-insulator wafer as the substrate for the RTD fabrication. Within the method of the invention, the wafer can be a Si on insulator (SOI), a Ge on insulator (GOI) or a SiGe on insulator (SiGe—OI) wafer, depending on the nature of the quantum well that is desired. Within the present embodiment a SOi wafer is used as a substrate, but the choice should not be construed as a limitation on the generality of the invention.

As is well known in the art, the SOI substrate (20) is a tri-layer including a lower Si layer (100), on which is formed a layer of insulating material (110), typically $SiO_2$, which is also called a buried oxide or "BOX" layer, on which is formed an upper layer (50) of monocrystalline silicon (the SOI layer). The upper layer, which will become the quantum well layer, has been reduced in thickness, by an etching process such as oxidation or chemical mechanical polishing, to a final thickness of less than 10 nm. It is understood that the thickness of the well in this embodiment is sufficient to form a plurality of electron bound states, with at least one bound state being required, and associated energy levels in order to provide the required resonant tunneling. It is also understood that electron scattering within the well can be reduced by reducing the thickness of the well and that such reductions can be used to optimally tune the performance characteristics of the RTD device. Apart from this, an n-type or a p-type doping with doping level between approximately $10^{16}$ to $10^{19}$ $cm^{-3}$ is used to further tune the performance characteristics of the RTD device.

Figure 2B:
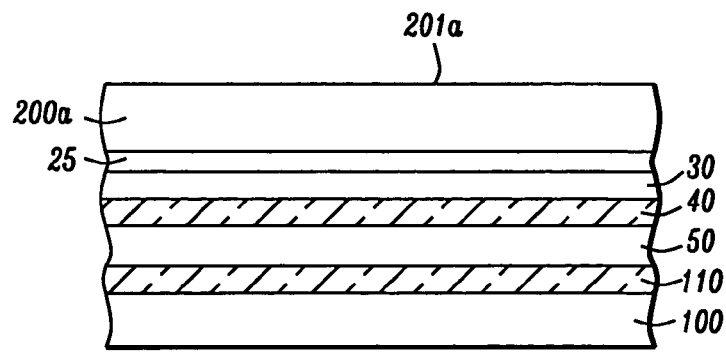

Referring next to FIG. 2b, there is shown the formation of a thin layer (40) of low band offset, high-K dielectric material, such as $SiO_2$, $Si_3N_4$, $Al_2O_3$, $Y_2O_3$, $Ta_2O_5$, $TiO_2$, $HfO_2$, $Pr_2O_3$, $ZrO_2$, or their alloys and laminates as discussed earlier. This layer is deposited on the thin silicon layer (50) by a method such as chemical-vapor deposition (CVD), atomic-layer deposition (ALD), or sputtering, to a thickness between approximately 0.5 nm. and 5.0 nm. This layer will serve as the lower tunneling barrier layer. Immediately following this deposition, a layer (30) of n+ polysilicon (polysilicon, heavily n-doped in situ) is deposited on the barrier layer to a thickness approximately 0.5 $\mu m$ (microns), using methods such as e-beam evaporation, CVD, ALD (atomic layer deposition), or sputtering. It is noted that all layer depositions in the fabrication are accomplished using methods known in the art, such as those cited above and also including LPCVD (low pressure chemical vapor deposition), APCVD (atmospheric pressure chemical vapor deposition) and MOCVD. The polysilicon layer will ultimately serve as the injection electrode of the RTD. A first metal barrier layer (25), preferably a layer of Ti whose purpose is to prevent Cu diffusion of a subsequently deposited Cu layer, is deposited to a thickness between approximately 2 nm and 200 nm on the polysilicon layer.

A first metal bonding layer, which can be formed as a thin film or patterned to form a bonding pad, which is formed of Cu (200a) in this embodiment, but which can be Au or other suitable metal, is formed on the Ti barrier layer to a thickness between approximately 2 nm and 200 nm. This bonding layer (film or bonding pad), which has an exposed surface (201a) will ultimately be thermocompressionally bonded, at that exposed surface, to a corresponding exposed surface of a second, identical Cu (or Au) bonding layer (or bonding pad), to be formed on a handling wafer (the wafer having the already formed required circuitry) as described below.

Figure 2C:
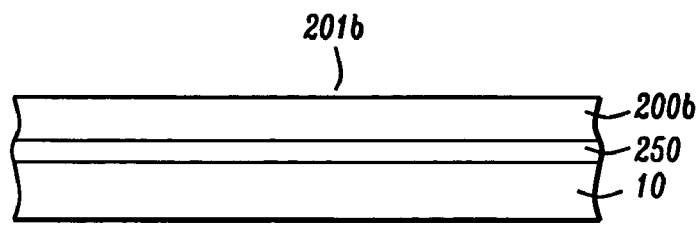

Referring next to FIG. 2c, there is shown a second substrate (10), denoted a handling wafer or handling substrate, already including CMOS/BTJ/SiGe circuitry (not shown) and associated vias and interconnects (not shown) by which electrical connections and integration will be achieved. In accord with the objects of the invention, this handling wafer will be bonded to the SOI wafer already described above. To prepare for the bonding, a second metal barrier layer is formed on the handling wafer, preferably a Ti barrier layer (250), whose dimensions, method of formation and purpose is identical to layer (25) in FIG. 2b. A second Cu bonding layer (200b) is formed on the Ti barrier layer, to the same thickness as first Cu layer (200a) of FIG. 2b. This second Cu layer (200b) will be subsequently thermocompressionally bonded at its exposed surface (201b) to the exposed surface (201a) of first Cu layer. As already noted, the handling wafer (10) will typically contain the CMOS/BTJ/SiGe devices and circuitry to which the RTD will be physically and electrically interconnected by means of the bonding layer and with which it will thereby be integrated. Physical and electrical interconnections between the RTD and the circuitry within the handling wafer will be made as a result of the joining of the wafers by the Cu-to-Cu bonding layers (films or pads) (200a) and (200b) and electrical connections are also made by interconnects passing through vias (not shown) that pass between the various layers of the fabrication and are aligned (using conventional alignment tools) during the bonding process. Depending on the nature and location of the circuitry in the handling wafer, the Cu bonding pads may be patterned to allow access to vias and interconnects or the vias and interconnects may be formed peripherally to the bonding pads. As an alternative to the Cu bonding pads and layers, connecting layers and pads of other appropriate metals can be used, in which case the invention would include metal "A" to metal "B" bonding pads.

Figure 2D:
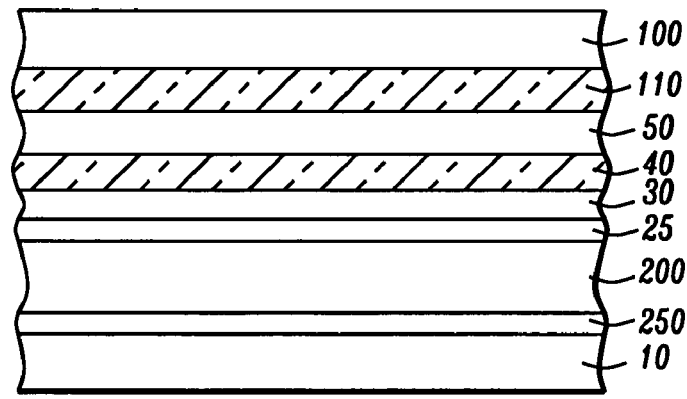

Referring next to FIG. 2d, there is shown the thermocompressional bonding of the first and second Cu layers at their exposed surfaces, to join, thereby, the fabrication of FIG. 2c with the fabrication of FIG. 2b. A detailed description of the prior art method of thermocompressional bonding is to be found in Rafael Reif et al., cited above. It is noted that the bonding process requires alignment of the substrates so that conducting interconnects pass correctly through corresponding vias insuring proper electrical connections between the circuitry. The alignment can be achieved using conventional alignment tools.

The bonded, combined (200a)–(200b) Cu layers will be collectively denoted as bonded layer (200). It is noted that other appropriate bonding methods can also be used to satisfy the objects of the invention, namely: anodic bonding, eutectic bonding, plasma bonding, Si—Si bonding or polymer bonding. Several of these bonding methods can be implemented to bond the two substrates (SOI substrate and handling substrate) without the use of the metal bonding layers (200a) and (200b). The remaining layers formed above bonded layer (200) are the layers of FIG. 2b, now inverted because of the face-to-face bonding that has occurred.

Figure 2E:
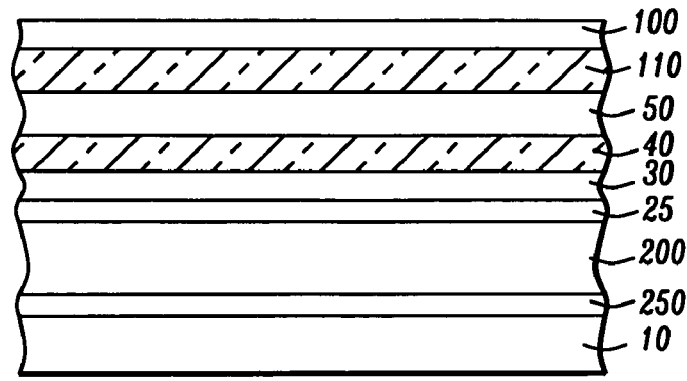

Referring next to FIG. 2e, there is shown the fabrication of FIG. 2d wherein the lower Si layer (100) of the SOI first substrate (now shown as an upper layer in the fabrication) has been reduced in thickness to a thickness of approximately 40 microns by an etching process such as grinding.

Figure 2F:
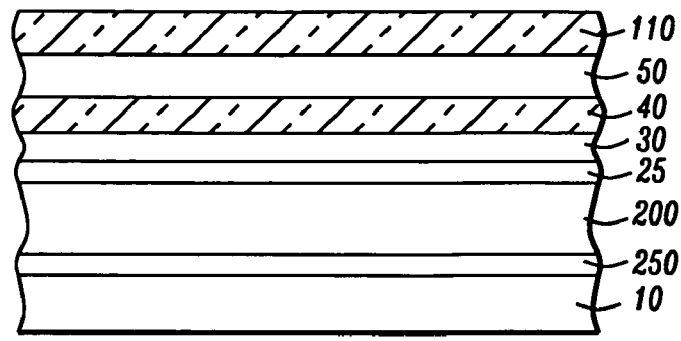

Referring next to FIG. 2f, there is shown the fabrication of FIG. 2e after a continuation of the etch of layer (100), this time using an $XeF_2/SF_6$ plasma etch, has removed the remaining Si layer (100), wherein the $SiO_2$ BOX layer (110) serves as an etch-stop layer.

Figure 2G:
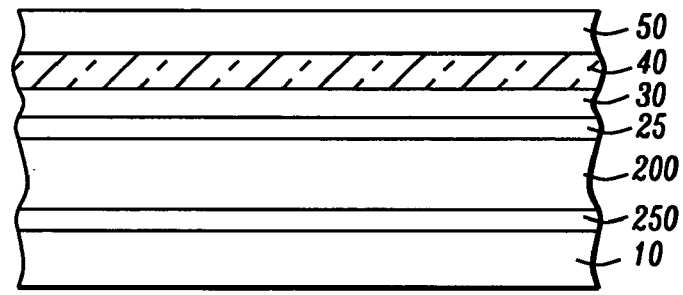

Referring next to FIG. 2g, there is shown the removal of BOX layer ((110) in 2f) using a buffered oxide etch, hydrophilic acid or other oxide etches well known in the art. In this etch, the Si quantum well layer (50) serves as an etch-stop layer.

Figure 2H:
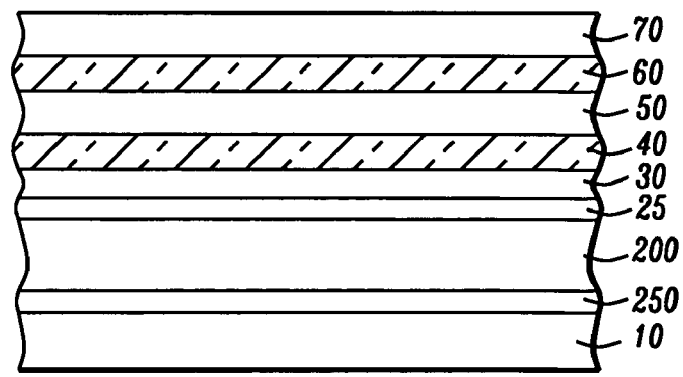

Referring next to FIG. 2h, there is shown the formation of an upper dielectric barrier layer (60) on the quantum well layer (50). The upper dielectric barrier layer is formed of the same materials, in the same manner and to the same thickness as the lower barrier layer (40). A metal collecting electrode (70), preferably a layer of Ti, formed to a thickness between approximately 2 nm and 200 nm is formed on the upper dielectric barrier layer.

Figure 2I:
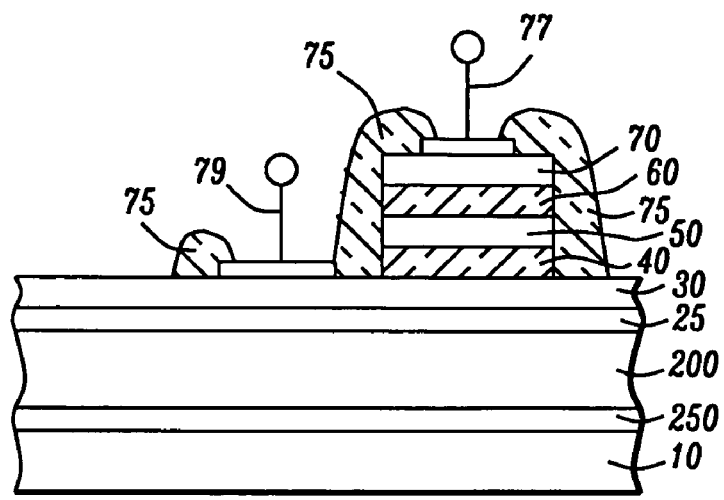

Referring finally to FIG. 2i, there is shown the results of a sequence of patterning and device isolation steps and contact formations to produce the final RTD device configuration. First, a desired RTD device area is defined by a patterning process that etches away peripheral portions of RTD layers (70), (60), (50) and (40), stopping at the upper surface of the injection electrode (30), leaving substantially vertical edges that define a regular horizontal cross-sectional area. Then SiN isolation layers (75) are laterally disposed against the edges of the patterned RTD device. A contact (77) is made to the collection electrode (70) and a contact (79) is also made to the injection electrode (30). It is through these contacts that electrical connections are made to the RTD. Connections, both physical and electrical, between the RTD and whatever embedded CMOS/BTJ/SiGe devices and circuits are contained (not shown) within the handling wafer (10) are made by means of the Cu bonding pads (200) and by interconnecting vias (not shown) that pass through the various layer formations.

A second embodiment of the present invention is fabricated using a SOI wafer as in the previous embodiment and applying what is denoted the "smart-cut" technique (a cleavage technique known in the art) to laterally cleave its upper Si layer, then thin it further so that it can be used as a Si well.

Figure 3A:
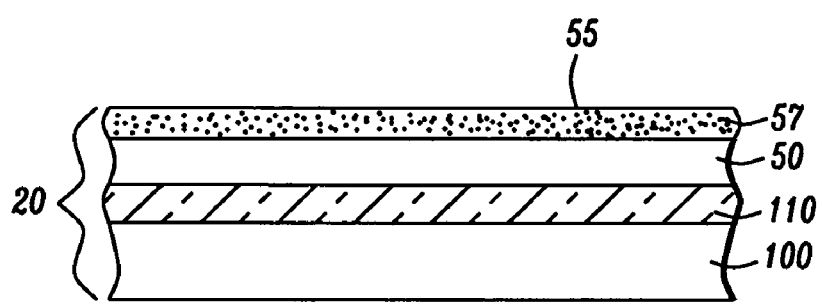
FIGS. 3a–g are a series of schematic illustrations of the process flow in forming a double barrier resonant tunnel diode using the "smart-cut" technique, a particular fabrication technique appropriate to certain forms of Si substrate.

Referring to FIG. 3a, there is shown the first step in this fabrication method in which an upper Si layer (50) of a SOI wafer (20) is implanted through an upper surface (55) with hydrogen to a depth that is less than 100 nm. The implant is represented as shaded region (57). It is noted that the implanted hydrogen, when combined with appropriate subsequent thermal processing of the wafer, produces a lateral cleavage of the upper Si layer (50) (hence the term, "smart-cut") allowing the lower portion of the layer and the remainder of the SOI substrate beneath it to be removed. It is not the purpose of this invention to describe the smart-cut process, only to indicate that it is a known method of producing a lateral cleavage of the upper monocrystalline Si layer in an SOI wafer. To achieve the objects of the present invention, the smart-cut process is applied to a SOI wafer already bonded to another Si substrate, whereby the already bonded portion of the cleaved Si layer can be thinned to quantum well proportions while the remainder of the SOI substrate is removed.

Figure 3B:
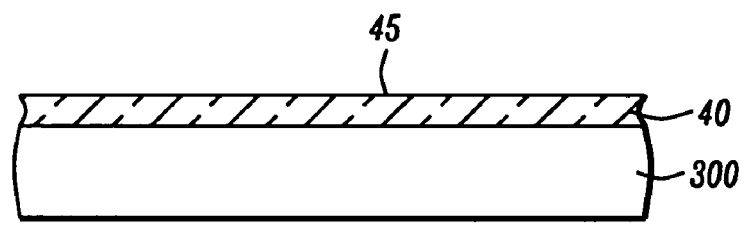

Referring next to FIG. 3b, there is shown a second substrate (300), which is a doped Si substrate that will ultimately serve as an injection electrode. A layer of high-K dielectric material (40), such as $SiO_2$, $Si_3N_4$, $Al_2O_3$, $Y_2O_3$, $Ta_2O_5$, $TiO_2$, $HfO_2$, $Pr_2O_3$, $ZrO_2$, or their alloys and laminates, is deposited on the second substrate and formed to a thickness less than 3 nm. The layer has an upper surface denoted (45). This layer will serve as the lower dielectric barrier layer for the finally formed RTD.

Figure 3C:
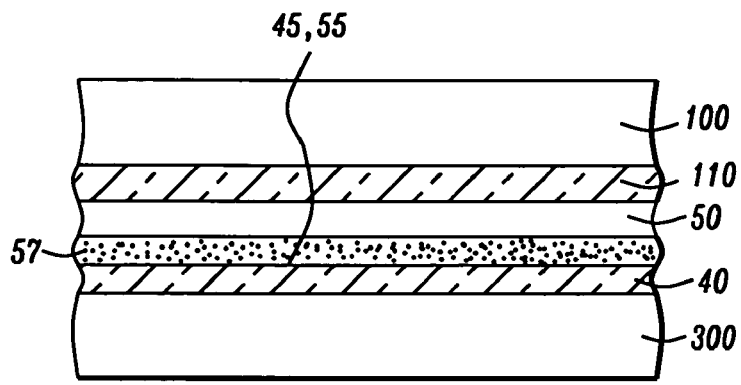

Referring next to FIG. 3c, there is shown the second substrate (300) with the upper surface (45) of its barrier layer (40) bonded to the upper surface (55) of the hydrogen implanted Si layer (50) of the SOI wafer. The surface-to-surface bonding is achieved by low temperature plasma bonding or fusion bonding.

Figure 3D:
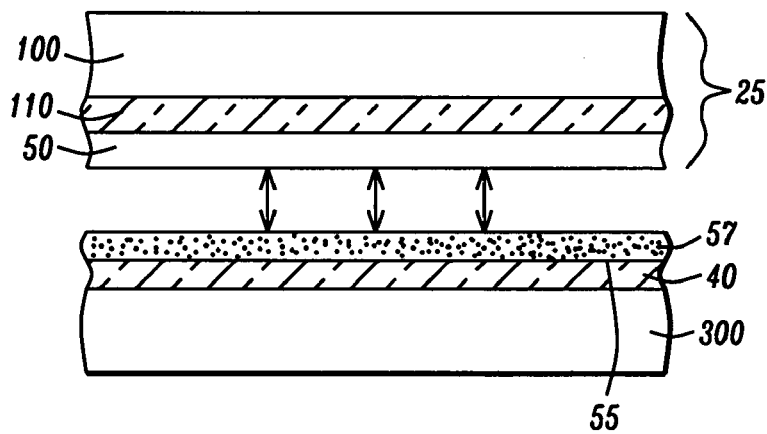

Referring next to FIG. 3d, there is shown the SOI wafer, subsequent to thermal processing in accord with the smart-cut process, now cleaved parallel to the surface plane (55) of its hydrogen implanted Si layer (57), leaving the hydrogen implanted layer adhering to dielectric layer (40). The remainder of the SOI wafer, now denoted (25) is shown separated from the cleaved portion by double arrows. It will be discarded.

Figure 3E:
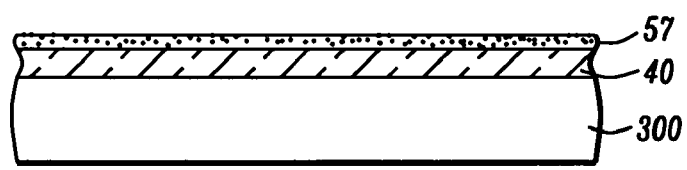

Referring to FIG. 3e, there is shown the fabrication of FIG. 3d wherein the cleaved-away portion of the SOI wafer has been removed and the remaining cleaved portion (57) of the implanted layer, bonded to the barrier layer (40), has been smoothed and thinned by a method such as CMP to the quantum well thickness of less than 10 nm.

Figure 3F:
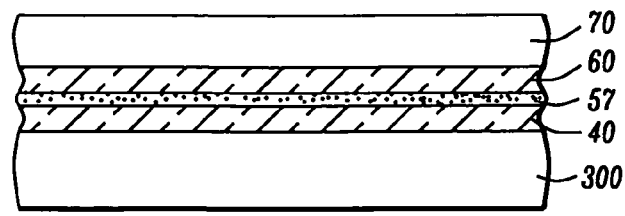

Referring next to FIG. 3f, there is shown the formation, on the quantum well layer (57), of an upper dielectric barrier layer (60), formed of the same high-K dielectric material and to the same thickness as the lower barrier layer (40). A metal collection electrode (70) is then formed on the upper barrier layer, the electrode being formed of a metal like Ti and to a thickness between 2 nm and 200 nm.

Figure 3G:
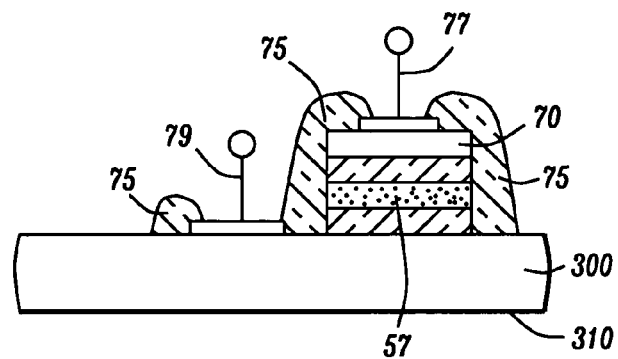

Referring finally to FIG. 3g, there is shown the results of a sequence of patterning and device isolation steps and contact formations to produce the final RTD device configuration in a manner substantially identical to that described in FIG. 2i. First, a desired RTD device area is defined by a patterning process that etches away peripheral portions of the RTD layers (70), (60), (57) and (40), stopping at injection electrode layer (300). Then SiN isolation layers (75) are laterally disposed about the edges of the patterned RTD device. A contact (77) is made to the collection electrode (70) and a contact (79) is also made to the injection electrode (30).

The lower surface (310) of the substrate (300) serving as an injection electrode can now be conventionally bonded to a handling substrate (not shown) that contains embedded CMOS/BTJ/SiGe devices and circuits. This bonding does not require metal—metal thermocompressional bonding, but can be done using such conventional methods as Si—Si bonding, polymer bonding, eutectic bonding, plasma bonding, and other methods known in the art. Conducting interconnects, such as those shown schematically in FIG. 4 below, aligned during the bonding process, can provide the electrical connections between the RTD device and the circuitry level in the additional substrate.

Figure 4:
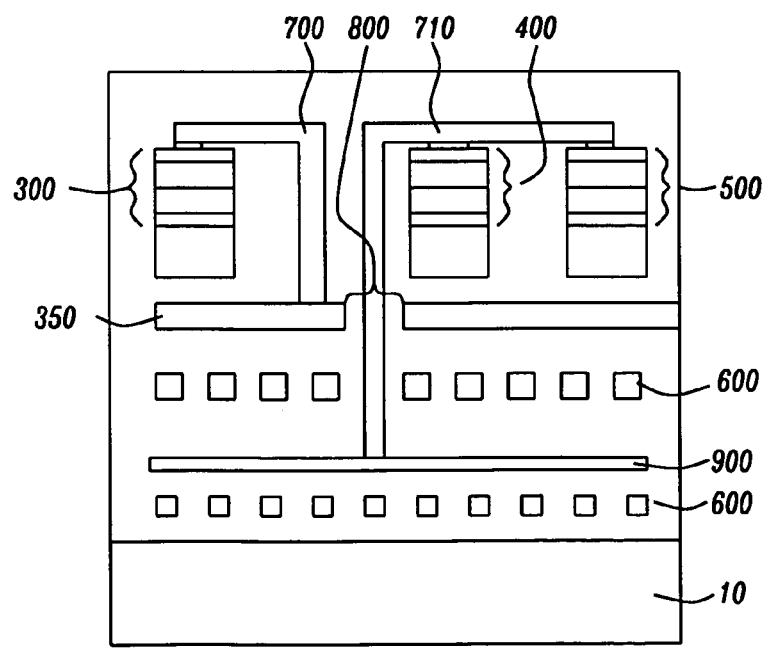
FIG. 4 is a schematic cross-sectional illustration showing an exemplary integration of three double barrier resonant tunnel diode with CMOS/BJT/SiGe circuits and/or devices, using Cu—Cu bonding pads and conducting interconnects.

Referring finally to FIG. 4, there is shown a schematic diagram illustrating the integration of three RTD devices (400), (500) and (600) with a handling substrate (10) on which several levels of CMOS/BJT/SiGe devices and circuits are formed. Small squares (600) symbolically indicate possible circuit elements at different levels. A conducting interconnect (700) runs from RTD (300) to a bonding pad (350). Another conducting interconnect (710) connects RTD's (400) and (500), through a via (800), to a bonding pad (900) connecting to a still lower level of circuitry. The Cu interconnects (700) and (710) are shown for example purposes only and the formation of such interconnects is known in the art and not described herein. As is noted above, the interconnections shown in this figure can be used whether the RTD is formed in accord with the method outlined in FIGS. 2a–i or in FIGS. 3a–g.

As is understood by a person skilled in the art, the preferred embodiment of the present invention is illustrative of the present invention rather than being limiting of the present invention. Revisions and modifications may be made to methods, processes, materials, structures, and dimensions through which is formed a double barrier RTD device that is integrated with CMOS/BTJ/SiGe devices and circuits through the thermocompressional bonding of Cu—Cu bonding pads, or other metal-to-metal bonding and conducting interconnects, to form a three-dimensional integrated architecture, while still providing such a three-dimensionally integrated and bonded RTD device, formed in accord with the present invention as defined by the appended claims.

What is claimed is:

1. A double barrier resonant tunneling diode (RTD) integrated with a CMOS/BJT/SiGe device and circuitry level by means of metal-to-metal bonding to form a three-dimensional (3-D) electrically interconnected architecture, comprising:

a substrate having a substantially horizontal planar upper surface, said substrate including an embedded level of CMOS/BJT/SiGe devices, structures and circuitry;

a first metal barrier layer formed on said planar upper surface;

a first metal bonding layer formed on said first metal barrier layer;

a horizontally layered, patterned RTD formed above the substrate, said RTD having an upper layer that is a collection electrode and a lower layer that is an injection electrode and said RTD having substantially vertical etched lateral edges against which are formed lateral isolation layers;

a second metal barrier layer formed on a lower surface of said injection electrode;

a second metal bonding layer formed on said second metal barrier layer, said second metal bonding layer being bonded to said first metal bonding layer by a process of metal-to-metal bonding, thereby joining the RTD to said substrate;

conducting interconnects electrically connecting the RTD to said CMOS/BJT/SiGe devices, structures and circuitry; and electrical connections formed on said injection and collection electrodes.

2. The fabrication of claim 1 wherein said patterned RTD comprises:

a quantum well layer formed of a semiconductor material, said layer having two parallel planar sides and being formed to a first thickness;

an upper tunneling barrier layer formed on one side of said quantum well layer and a lower tunneling barrier layer being formed on the other side of said of said quantum well layer, each said barrier layer being formed, to a second thickness, of a high-K dielectric material characterized by a low band offset relative to the conduction band edge of said semiconductor material; and a collection electrode formed on said upper tunneling barrier layer and an injection electrode formed on said lower tunneling barrier layer, wherein the collection electrode, the upper barrier layer, the quantum well layer and the lower barrier layer have been laterally etched to form vertical sides and a uniform horizontal cross-section.

3. The fabrication of claim 2 wherein said quantum well semiconductor material is monocrystalline Si, Ge or SiGe.

4. The fabrication of claim 2 wherein said low band offset dielectric material is the high-K dielectric material $SiO_2$, $Si_3N_4$, $Al_2O_3$, $Y_2O_3$, $Ta_2O_5$, $TiO_2$, $HfO_2$, $Pr_2O_3$, $ZrO_2$, or their alloys and laminates.

5. The fabrication of claim 2 wherein said tunneling barrier layer is formed to a thickness of less than 3 nm.

6. The fabrication of claim 3 wherein said Si quantum well layer is formed to a thickness less than 10 nm. and wherein said layer is characterized by at least one electron bound state and associated bound state energy.

7. The fabrication of claim 6 wherein the Si quantum well layer is doped with either n-type or p-type doping to a dopant concentration between approximately $10^{16}$ and $10^{19}$ $cm^{-3}$.

8. The fabrication of claim 2 wherein said injection and collection electrodes are layers of n+ doped polysilicon or a layer of metal.

9. The fabrication of claim 1 wherein said first and second bonding layers are layers of Cu of thickness between approximately 2 nm and 200 nm bonded to each other by thermocompressional bonding, or are layers of Au of thickness between approximately 2 nm and 200 nm bonded by to each other by thermocompressional bonding.

10. The fabrication of claim 1 wherein said metal barrier layers are layers of Ti formed to a thickness between approximately 2 nm and 200 nm.

11. The fabrication of claim 1 wherein said interconnects are Cu interconnects passing through vias that are aligned by said bonding process.

12. The fabrication of claim 1 wherein said metal-to-metal bonded layers provide electrical interconnections between said RTD and said substrate.

13. The fabrication of claim 1 wherein said bonding layers are formed as pads or as layers.

14. A double barrier resonant tunneling diode (RTD) integrated with a CMOS/BTJ/SiGe device and circuitry level by means of bonding to form a three-dimensional (3-D) electrically interconnected architecture, comprising:
   a first substrate having substantially horizontal planar upper and lower surfaces, said substrate forming an injection electrode;
   a horizontally layered, patterned RTD formed on the upper surface of said substrate and said RTD having substantially vertical etched lateral edges against which are formed lateral isolation layers; and
   a second substrate containing embedded CMOS/BTJ/SiGe devices and circuits, said substrate being bonded to the lower surface of said first substrate and said devices and circuits being electrically connected to said RTD by means of conducting interconnects electrically connected between the RTD and the embedded devices and circuitry.

15. The fabrication of claim 14 wherein said RTD comprises:
   a quantum well layer formed of a semiconductor material, said layer having parallel upper and lower surfaces and being formed to a first thickness;
   an upper tunneling barrier layer formed on an upper surface of said quantum well layer and a lower tunneling barrier layer being formed on a lower surface of said quantum well layer, each said barrier layer being formed, to a second thickness, of a high-K dielectric material characterized by a low band offset relative to the conduction band edge of said semiconductor material; and
   a collection electrode being formed on the upper barrier layer.

16. The fabrication of claim 15 wherein said quantum well semiconductor material is monocrystalline Si, implanted with hydrogen.

17. The fabrication of claim 15 wherein said low band offset dielectric material is the high-K dielectric material $SiO_2$, $Si_3N_4$, $Al_2O_3$, $Y_2O_3$, $Ta_2O_5$, $TiO_2$, $HfO_2$, $Pr_2O_3$, $ZrO_2$, or their alloys and laminates.

18. The fabrication of claim 15 wherein said dielectric barrier layers are formed to a thickness of less than 3 nm.

19. The fabrication of claim 16 wherein said Si quantum well layer is formed to a thickness less than 10 nm. and wherein said layer is characterized by at least one electron bound state and associated bound state energy.

20. The fabrication of claim 16 wherein the Si quantum well layer is doped with either n-type or p-type doping to a dopant concentration between approximately $10^{16}$ and $10^{19}$ $cm^{-3}$.

21. The fabrication of claim 15 wherein said conducting electrode is a layer of n+ doped polysilicon or a layer of metal.

22. A method of fabricating a double barrier resonant tunneling diode (RTD) integrated with a CMOS/BJT/SiGe device and circuitry level using metal—metal bonding to form a three-dimensional (3-D) electrically interconnected architecture, comprising:
   providing a substrate having a substantially horizontal planar upper surface, said substrate including an embedded level of CMOS/BJT/SiGe devices and circuitry;
   forming a first metal barrier layer on said planar upper surface;
   forming a first metal bonding layer on said metal barrier layer, said first bonding layer having an exposed surface;
   providing a semiconductor-on-insulator wafer including upper and lower semiconductor layers with an oxide layer formed therebetween;
   reducing the thickness of the upper semiconductor layer by a first etching process to form a quantum well layer;
   forming a lower dielectric tunneling barrier layer on said quantum well layer;
   forming an injection electrode layer on said lower tunneling barrier layer;
   forming a second metal barrier layer on said injection electrode;
   forming a second metal bonding layer on said second metal barrier layer, said second bonding layer having an exposed surface;
   bonding said first and second metal bonding layers at their exposed surfaces, said bonding process also aligning conducting interconnects and vias to said CMOS/BJT/SiGe devices and circuitry;
   reducing the thickness of the lower semiconductor layer by a second etching process;
   removing the lower semiconductor layer by a third etching process;
   removing the substrate oxide layer by a fourth etching process, exposing, thereby, an upper surface of said quantum well layer;
   forming an upper dielectric tunneling barrier layer on said upper surface;
   forming a collection electrode on said upper dielectric tunneling barrier;
   patterning an RTD device of regular horizontal cross-sectional area by a fifth etching process that etches vertically through said collection electrode, said upper tunneling barrier, said quantum well layer and said lower tunneling barrier, said etch stopping at an upper surface of said injection electrode and said etch removing said layers peripheral to said area;
   forming an isolation layer against the vertically etched sides of said RTD device;
   forming electrical contacts to said injection electrode and said collection electrode.

23. The method of claim 22 wherein said dielectric barrier layer material is the high-K dielectric material $SiO_2$, $Si_3N_4$, $Al_2O_3$, $Y_2O_3$, $Ta_2O_5$, $TiO_2$, $HfO_2$, $Pr_2O_3$, $ZrO_2$, or their alloys and laminates.

24. The method of claim 22 wherein said barrier layer is formed to a thickness of less than 3 nm.

25. The method of claim 22 wherein said substrate is a SOI substrate and a corresponding Si quantum well layer is formed to a thickness less than 10 nm. and wherein said layer is characterized by at least one electron bound state and associated bound state energy.

26. The method of claim 25 wherein the silicon quantum well layer is doped with either n-type or p-type doping to a dopant concentration between approximately $10^{16}$ and $10^{19}$ cm$^{-3}$.

27. The method of claim 22 wherein said injection electrode is a layer of n+ doped polysilicon or a layer of metal.

28. The method of claim 22 wherein each said metal bonding layer is a layer of Cu of thickness between approximately 2 nm and 200 nm or a layer of Au of thickness between approximately 2 nm and 200 nm and the layers are thermocompressionally bonded to each other.

29. The method of claim 22 wherein said metal barrier layers are layers of Ti formed to a thickness between approximately 2 nm and 200 nm.

30. The method of claim 22 wherein said first etch is produced by oxidation or CMP, the second etch is produced by grinding, the third etch is a plasma etch, the fourth etch is a buffered oxide etch or hydrophilic acid etch and the fifth etch can be accomplished using a method such as IBE.

31. A method of forming a double barrier resonant tunneling diode (RTD) integrated with a CMOS/BJT/SiGe device and circuitry level by means of bonding to form a three-dimensional (3-D) electrically interconnected architecture, comprising:
   providing an SOI wafer first substrate, said substrate including an upper Si layer having an upper surface, a lower Si layer and an oxide layer formed therebetween;
   implanting the upper Si layer with hydrogen to an approximate depth d;
   providing a second Si substrate having a substantially horizontal planar upper surface, said substrate being doped to form an injection electrode;
   forming a first dielectric tunneling barrier layer on said injection electrode, said barrier layer having an upper surface;
   bonding the upper surface of the upper Si layer of the SOI wafer to the upper surface of said barrier layer;
   horizontally cleaving said upper Si layer of the SOI wafer, a portion of approximate thickness d having an exposed upper surface remaining on said barrier layer and the remainder of said SOI wafer being removed;
   smoothing and thinning said upper Si layer portion to form, thereby, a quantum well layer;
   forming a second dielectric tunneling barrier layer on said quantum well layer;
   forming a collection electrode on said second tunneling barrier layer;
   forming a patterned RTD device by etching laterally separated vertical sides through said collection electrode, said upper tunneling barrier layer, said quantum well layer and said lower tunneling barrier layer, said etch stopping at an upper surface of said injection electrode and said etch removing all portions of said layers peripheral to said sides;
   forming an isolation layer against each of the vertically etched sides of said RTD device;
   forming electrical contacts to said injection electrode and said collection electrode.

32. The method of claim 31 further comprising:
   providing a third substrate containing embedded CMOS/BTJ/SiGe devices and circuitry;
   bonding, using a second bonding process, said RTD device to said third substrate and forming aligned electrical interconnects therebetween, said interconnects producing an integration of said RTD device and said embedded devices and circuitry.

33. The method of claim 31 wherein said first and second dielectric barrier layers are formed of the high-K dielectric material $SiO_2$, $Si_3N_4$, $Al_2O_3$, $Y_2O_3$, $Ta_2O_5$, $TiO_2$, $HfO_2$, $Pr_2O_3$, $ZrO_2$, or their alloys and laminates.

34. The method of claim 31 wherein said dielectric barrier layers are formed to a thickness of less than 3 nm.

35. The method of claim 31 wherein d is approximately 100 nm.

36. The method of claim 31 wherein said Si quantum well layer is thinned to a thickness less than 10 nm. and wherein said layer is characterized by at least one electron bound state and associated bound state energy.

37. The method of claim 31 wherein said bonding is achieved using Si—Si bonding or plasma fusion bonding.

38. The method of claim 32 wherein said second bonding process is anodic bonding, thermal compression, eutectic bonding, plasma bonding, silicon-to-silicon bonding, silicon dioxide bonding, silicon nitride bonding and polymer bonding.

39. The method of claim 31 wherein said first and second tunneling barrier layers and said electrodes are formed using LPCVD, APCVD, MOCVD or ALD.

40. The method of claim 31 wherein said upper Si layer cleavage is a result of said hydrogen implantation and subsequent thermal processing.

* * * * *